July 3, 1951 C. E. SMITH 2,558,790
LOCAL OSCILLATOR FREQUENCY CONTROL FOR SUPERHETERODYNE RECEIVERS AND CONTROL DEVICES
Filed April 1, 1946
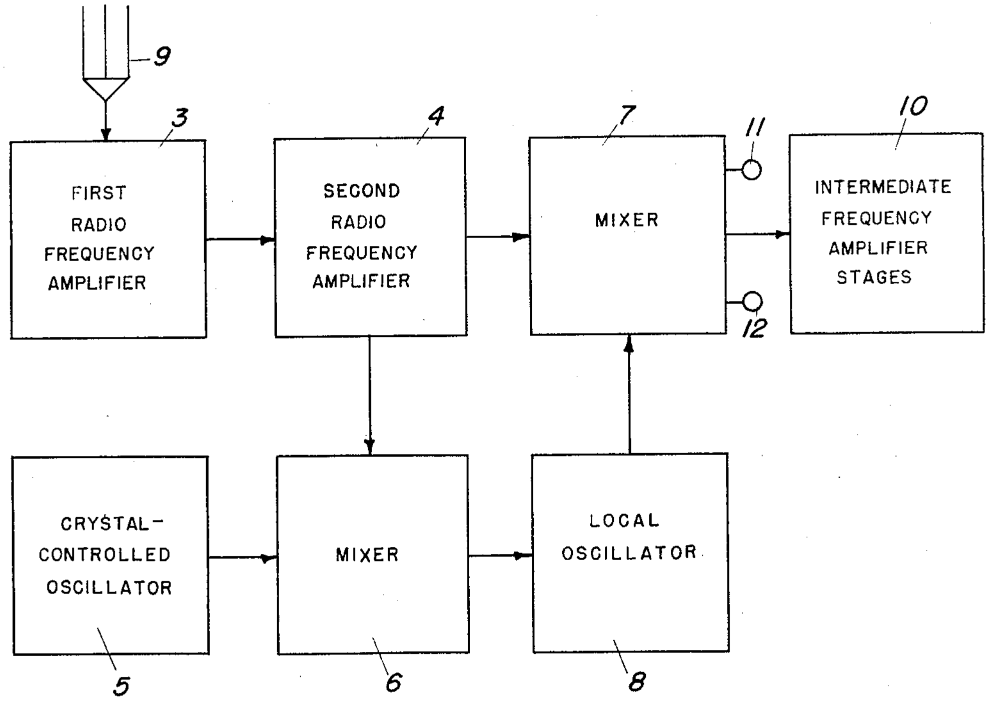
Inventor
Cecil E. Smith
By [signature]
Attorney Patented July 3, 1951

2,558,790

UNITED STATES PATENT OFFICE 2,558,790

LOCAL OSCILLATOR FREQUENCY CONTROL FOR SUPERHETERODYNE RECEIVERS AND CONTROL DEVICES

Cecil E. Smith, Siloam Springs, Ark.

Application April 1, 1946, Serial No. 658,720

3 Claims. (Cl. 250—20)

(Granted under the act of March 3, 1883, as amended April 30, 1928; 370 O. G. 757)

This invention relates to superheterodyne receivers, and more particularly to a system for controlling the local oscillator frequency in superheterodyne receivers.

This invention also relates to a system, contained within the proposed superheterodyne receiver, for aligning the intermediate frequency amplifiers of said receiver.

A primary object of this invention is to provide a superheterodyne receiver that will amplify and pass an optimum intermediate frequency dispensing with the manual tuning of the local oscillator.

A further object of this invention is to provide a superheterodyne receiver with means of aligning the intermediate frequency amplifier of that receiver.

A still further object of this invention is to provide a superheterodyne receiver in which the tuning of the radio-frequency amplifier stages automatically provides the proper local oscillator frequency.

Another object of this invention is to provide a control device capable of operating suitable control means at a fixed frequency regardless of variations in the radio frequency control signal.

Other objects of this invention will become apparent from the description following hereinafter with reference to the accompanying drawing in which the figure of the drawing is a block diagram of the proposed invention.

Considerable difficulty has been experienced in the past with prior art methods of tuning superheterodyne radio receivers, accountable to the drifting frequency of the tuneable local oscillator, incorrect alignment of the local oscillator over the desired frequency band because of improper tracking of the ganged tuning condensers, improper alignment of the intermediate frequency amplifier stages of the receiver, incremental frequency drifts of the carrier wave, or a combination of any or all of these effects. The apparatus set forth herein provides a means for the elimination of those undesirable features.

In the arrangement illustrated by the figure of the drawing, the invention in general consists of one or several radio frequency amplifiers 3 and 4 depending upon the particular requirements, a crystal-controlled oscillator 5, two radio frequency mixers 6 and 7, and a relatively unstable tuneable local oscillator 8, all components being conventional in design familiar to those skilled in the art. Radio frequency signals are coupled from a suitable antenna circuit 9 to the input circuit of the first radio frequency amplifier for amplification. A second radio frequency amplifier 4 is used to further amplify the original signal, the output of the second radio frequency amplifier 4, or in the general case, the last radio frequency amplifier employed, being fed into two circuits. Each output is coupled to the input circuits of separate radio frequency mixers 6 and 7. A crystal-controlled oscillator 5 operating at the desired intermediate frequency of the receiver is also coupled to the input stages of the radio frequency mixer 6. Non-linear properties of the electronic device employed as the radio frequency mixer 6 cause the amplified radio frequency signals to heterodyne with the output oscillations of the crystal-controlled oscillator 5. The output circuit of the radio frequency mixer 6 can then be tuned for either the sum or difference frequency as desired. The described sum or difference frequency is then coupled to the input circuit of the unstable oscillator 8 and utilized therein to provide frequency synchronization or stability to that oscillator 8 at the sum or difference frequency. This synchronized frequency is introduced to the second mixer circuit 7 where it heterodynes with the amplified radio frequency signals to produce the preselected intermediate frequency audio modulated at the original audio frequency rate. Regardless of the frequency of the incoming radio frequency carrier signal, the intermediate frequency thus produced will always be at the selected intermediate frequency value. For example, assume a carrier signal frequency of 100 megacycles and a crystal and intermediate frequency of 15 megacycles. The carrier signal and the output of the oscillator 5 will then heterodyne in the mixer 6 to produce the sum or difference frequencies of 115 or 85 megacycles respectively, either of these frequencies in turn stabilizing the local oscillator 8 at those values. However, for the purpose of the example, only the difference frequency of 85 megacycles will be considered, although it will be realized that the analysis will be similar for the sum frequency consideration. Introduction of the local oscillator frequency now stabilized at 85 megacycles will heterodyne with the 100 megacycle signal impressed on the radio frequency mixer 7 to produce the 15 megacycle intermediate frequency beat signal. Should the incoming carrier frequency increase, for instance, to 102 megacycles, the first mixer output will be 87 megacycles and, hence, the frequency of the local oscillator 8 will be the same value, 87 megacycles. Heterodyning the 102 megacycles with the 87 megacycles in the mixer 7 will produce the desired 15 megacycle intermediate frequency. Thus it can be seen that regardless of the value of the incoming carrier signal, the local oscillator 8 is synchronized to always oscillate at a frequency that will heterodyne with the incoming carrier to produce the same predetermined intermediate frequency.

A further use can be made of this invention by providing output terminals 11 and 12 to the mixer 7. A control device can be connected to the terminals 11 and 12 to provide control externally.

A still further use can be made of the invention for aligning the intermediate frequency amplifier stages 10 of the receiver. By disabling the radio frequency amplifiers 3 and 4, the mixer circuits 6 and 7, and the local oscillator 8, the crystal-controlled oscillator 5 can be coupled into the input stages of the intermediate frequency amplifier 10 thereby providing an oscillating signal that can be satisfactorily used for tuning the intermediate frequency amplifier stages 10, since the crystal-controlled oscillator and the intermediate frequency amplifiers are tuned for the same frequency.

The invention described herein may be manufactured and used by or for the Government of the United States of America for governmental purposes without the payment of any royalties thereon or therefor.

What is claimed is:

1. In a superheterodyne receiver the combination comprising: radiant energy receiving means; a crystal-controlled oscillator oscillating at a preselected frequency; a first mixer having its input terminals connected to the output of said radiant energy receiving means and the output of said crystal controlled oscillator for heterodyning said outputs, and having means for selecting one of the component frequencies of the heterodyne signal; an unstable local oscillator stabilized by the output of said first mixer; and a second mixer for combining the outputs of said unstable local oscillator and said radiant energy receiving means.

2. In a superheterodyne receiver, a signal input circuit, a crystal-controlled oscillator oscillating at a predetermined intermediate frequency, a first mixer for combining the output signals of said circuit and said oscillator to produce a beat frequency signal, a local oscillator, means for supplying said beat frequency signal to the input of said local oscillator to provide frequency synchronization at the beat frequency, and a second mixer for combining the outputs of said local oscillator and said signal circuit.

3. In a superheterodyne receiver, a signal input circuit, a relatively unstable local oscillator, a relatively stable oscillator oscillating at a predetermined frequency, means for combining the outputs of said circuit and said stable oscillator to produce a beat frequency signal, means for supplying said beat frequency signal to the input end of said local oscillator to provide frequency synchronization thereof at the beat frequency, and means for combining the outputs of said local oscillator and said circuit.

CECIL E. SMITH.

REFERENCES CITED

The following references are of record in the file of this patent:

UNITED STATES PATENTS

| Number | Name | Date |
|---|---|---|
| 1,941,070 | Bailey | Dec. 26, 1933 |
| 2,024,614 | Terry | Dec. 17, 1935 |
| 2,140,108 | Hunt | Dec. 13, 1938 |
| 2,379,721 | Koch | July 3, 1945 |
| 2,466,782 | Robins | Apr. 12, 1949 |

FOREIGN PATENTS

| Number | Country | Date |
|---|---|---|
| 471,610 | Great Britain | Sept. 8, 1937 |
| 551,472 | Great Britain | Feb. 24, 1943 |